(12) United States Patent
Moore et al.

(10) Patent No.: US 6,710,423 B2
(45) Date of Patent: Mar. 23, 2004

(54) CHALCOGENIDE COMPRISING DEVICE

(75) Inventors: John T. Moore, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/227,316

(22) Filed: Aug. 23, 2002

(65) Prior Publication Data

US 2003/0001229 A1 Jan. 2, 2003

Related U.S. Application Data

(62) Division of application No. 09/999,883, filed on Oct. 31, 2001, which is a division of application No. 09/797,635, filed on Mar. 1, 2001.

(51) Int. Cl.[7] .............................................. H01L 29/00
(52) U.S. Cl. ...................................................... 257/528
(58) Field of Search ................................ 257/528, 536, 257/537; 438/510, 518, 95, 535, 381, 382, 795; 365/225.7

(56) References Cited

U.S. PATENT DOCUMENTS

| | | | |
|---|---|---|---|
| 3,622,319 A | 11/1971 | Sharp | 96/27 |
| 3,743,847 A | 7/1973 | Boland | 250/510 |
| 4,269,935 A | 5/1981 | Masters et al. | 430/323 |
| 4,312,938 A | 1/1982 | Drexler et al. | 430/496 |
| 4,316,946 A | 2/1982 | Masters et al. | |

(List continued on next page.)

FOREIGN PATENT DOCUMENTS

| | | |
|---|---|---|
| JP | 56126916 A | 10/1981 |
| WO | WO 97/48032 | 12/1997 |
| WO | WO 99/28914 | 6/1999 |
| WO | 00/48196 A1 | 8/2000 |
| WO | 02/21542 A1 | 3/2002 |

OTHER PUBLICATIONS

Helbert et al., Intralevel hybrid resist process with submicron capability, SPIE vol. 333 Submicron Lithography, pp. 24–29 (1982).

(List continued on next page.)

Primary Examiner—Carl Whitehead, Jr.
Assistant Examiner—Jennifer M. Dolan
(74) Attorney, Agent, or Firm—Dickstein Shapiro Morin & Oshinsky LLP (57) ABSTRACT

A method of metal doping a chalcogenide material includes forming a metal over a substrate. A chalcogenide material is formed on the metal. Irradiating is conducted through the chalcogenide material to the metal effective to break a chalcogenide bond of the chalcogenide material at an interface of the metal and chalcogenide material and diffuse at least some of the metal outwardly into the chalcogenide material. A method of metal doping a chalcogenide material includes surrounding exposed outer surfaces of a projecting metal mass with chalcogenide material. Irradiating is conducted through the chalcogenide material to the projecting metal mass effective to break a chalcogenide bond of the chalcogenide material at an interface of the projecting metal mass outer surfaces and diffuse at least some of the projecting metal mass outwardly into the chalcogenide material. In certain aspects, the above implementations are incorporated in methods of forming non-volatile resistance variable devices. In one implementation, a non-volatile resistance variable device in a highest resistance state for a given ambient temperature and pressure includes a resistance variable chalcogenide material having metal ions diffused therein. Opposing first and second electrodes are received operatively proximate the resistance variable chalcogenide material. At least one of the electrodes has a conductive projection extending into the resistance variable chalcogenide material.

8 Claims, 4 Drawing Sheets

U.S. PATENT DOCUMENTS

| | | | | |
|---|---|---|---|---|
| 4,320,191 | A | 3/1982 | Yoshikawa et al. | 430/296 |
| 4,405,710 | A | 9/1983 | Balasubramanyam et al. | 430/311 |
| 4,419,421 | A | 12/1983 | Wichelhaus et al. | |
| 4,499,557 | A | 2/1985 | Holmberg et al. | 365/163 |
| 4,671,618 | A | 6/1987 | Wu et al. | |
| 4,795,657 | A | 1/1989 | Formigoni et al. | 427/96 |
| 4,800,526 | A | 1/1989 | Lewis | |
| 4,847,674 | A | 7/1989 | Sliwa et al. | 357/67 |
| 5,177,567 | A | 1/1993 | Klersy et al. | 257/4 |
| 5,219,788 | A | 6/1993 | Abernathey et al. | 437/187 |
| 5,238,862 | A | 8/1993 | Blalock et al. | 437/52 |
| 5,272,359 | A | 12/1993 | Nagasubramanian et al. | |
| 5,314,772 | A | 5/1994 | Kozicki | |
| 5,315,131 | A | 5/1994 | Kishimoto et al. | 257/57 |
| 5,350,484 | A | 9/1994 | Gardner et al. | 156/628 |
| 5,360,981 | A | 11/1994 | Owen et al. | 257/4 |
| 5,500,532 | A | 3/1996 | Kozicki et al. | |
| 5,512,328 | A | 4/1996 | Yoshimura et al. | 427/498 |
| 5,512,773 | A | 4/1996 | Wolf et al. | 257/471 |
| 5,726,083 | A | 3/1998 | Takaishi | 438/210 |
| 5,751,012 | A | 5/1998 | Wolstenholme et al. | 257/5 |
| 5,761,115 | A | 6/1998 | Kozicki et al. | 365/182 |
| 5,789,277 | A | 8/1998 | Zahorik et al. | 438/95 |
| 5,837,564 | A * | 11/1998 | Sandhu et al. | 438/95 |
| 5,841,150 | A | 11/1998 | Gonzalez et al. | 257/3 |
| 5,846,889 | A | 12/1998 | Harbison et al. | 501/40 |
| 5,896,312 | A | 4/1999 | Kozicki et al. | 365/153 |
| 5,914,893 | A | 6/1999 | Kozicki et al. | 365/107 |
| 5,920,788 | A | 7/1999 | Reinberg | 438/466 |
| 5,998,066 | A | 12/1999 | Block et al. | 430/5 |
| 6,072,716 | A | 6/2000 | Jacobson et al. | |
| 6,077,729 | A * | 6/2000 | Harshfield | 438/128 |
| 6,084,796 | A | 7/2000 | Kozicki et al. | 365/153 |
| 6,111,264 | A * | 8/2000 | Wolstenholme et al. | 257/3 |
| 6,117,720 | A | 9/2000 | Harshfield | 438/238 |
| 6,143,604 | A | 11/2000 | Chiang et al. | 438/253 |
| 6,147,395 | A * | 11/2000 | Gilgen | 257/529 |
| 6,177,338 | B1 | 1/2001 | Liaw et al. | 438/128 |
| 6,236,059 | B1 | 5/2001 | Wolstenholme et al. | 257/3 |
| 6,297,170 | B1 | 10/2001 | Gabriel et al. | 438/738 |
| 6,300,684 | B1 | 10/2001 | Gonzalez et al. | 257/774 |
| 6,316,784 | B1 | 11/2001 | Zahorik et al. | 257/3 |
| 6,329,606 | B1 | 12/2001 | Freyman et al. | 174/260 |
| 6,329,666 | B1 * | 12/2001 | Doan et al. | 257/3 |
| 6,348,365 | B1 | 2/2002 | Moore et al. | 438/130 |
| 6,350,679 | B1 | 2/2002 | McDaniel et al. | 438/634 |
| 6,376,284 | B1 | 4/2002 | Gonzalez et al. | 438/129 |
| 6,388,324 | B2 | 5/2002 | Kozicki et al. | |
| 6,391,688 | B1 | 5/2002 | Gonzalez et al. | 438/128 |
| 6,414,376 | B1 | 7/2002 | Thakur et al. | 257/640 |
| 6,418,049 | B1 | 7/2002 | Kozicki et al. | 365/174 |
| 6,423,628 | B1 | 7/2002 | Li et al. | 438/622 |
| 6,429,449 | B1 * | 8/2002 | Gonzalez et al. | 257/3 |
| 6,469,364 | B1 | 10/2002 | Kozicki | |
| 6,473,332 | B1 | 10/2002 | Ignatiev et al. | |
| 6,487,106 | B1 | 11/2002 | Kozicki | |
| 2002/0000666 | A1 | 1/2002 | Kozicki et al. | |
| 2002/0123170 | A1 | 9/2002 | Moore et al. | |
| 2002/0127886 | A1 | 9/2002 | Moore et al. | |
| 2002/0163828 | A1 | 11/2002 | Krieger et al. | |
| 2002/0168820 | A1 | 11/2002 | Kozicki | |
| 2002/0190350 | A1 | 12/2002 | Kozicki | |
| 2003/0001229 | A1 | 1/2003 | Moore et al. | |
| 2003/0027416 | A1 | 2/2003 | Moore | |
| 2003/0035314 | A1 * | 2/2003 | Kozicki | 365/150 |
| 2003/0035315 | A1 | 2/2003 | Kozicki | |
| 2003/0137869 | A1 | 7/2003 | Kozicki | |

OTHER PUBLICATIONS

Kozicki et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki et al., Nanoscale effects in devices based on chalcogenide solid solutions, Superlattices and Microstructures, 27, 485–488 (2000).

Kozicki et al., Nanoscale phase separation in Ag–Ge–Se glasses, Microelectronic Engineering, vol. 63/1–3, 155–159 (2002).

M.N. Kozicki and M. Mitkova, Silver incorporation in thin films of selenium rich Ge–Se glasses, Proceedings of the XIX International Congress on Glass, Society for Glass Technology, 226–227 (2001).

Hirose, et al., "Highly Speed Memory Behavior and Reliability of an Amorphous $As_2S_3$ Film Doped with Ag", Jul. 17, 1980, pp. K187–K190.

Hirose, et al., "Polarity–dependent memory switching and behavior of Ag dendrite in Ag–photodoped amorphous $As_2S_3$ films", Journal of Applied Physics, vol. 47, No. 6, Jun. 1978, pp. 2767–2772.

Kawaguchi, et al., "Optical, electrical, and structural properties of amorphous Ag–GeS and Ag–Ge–Se films and comparison of photoinduced and thermally induced phenomena of both systems", Journal of Applied Physics, 79, Jun. 1996, pp. 9096–9104.

Axon Technologies Corporation, Technology Description: *Programmable Metallization Cell (PMC)*, (pre–Jul. 7, 2000) pp. 1–6.

Shimakawa et al., Photoinduced effects and metastability in semiconductors and insulators, 44 Advances in Physics No. 6, 475–588 (Taylor & Francis Ltd. 1995).

Mitkova, "Insulating and Semiconducting Glasses", Editor: P. Boolchand, World Scientific, New Jersey, 2000, pp. 813–843.

Kluge, et al., "Silver photodiffusion in amorphous $Ge_xSe_{100-x}$", Journal of Non–Crystalline Solids 124 (1990) pp. 186–193.

Kolobov, A.V., "Photodoping of amorphous calcogenides by metals", Advances in Physics, 1991, vol. 40, No. 5, pp. 625–684.

Mitkova, et al. "Dual Chemical Role of Ag as an Additive in Chalcogenide Glasses", Physical Review Letters, Vo.. 83, No. 19, pp. 3848–3851.

Das et al., Theory of the characteristic curves of the silver chalcogenide glass inorganic photoresists, 54 Appl. Phys. Lett., No. 18, pp. 1745–1747 (May 1989).

Helbert et al., Intralevel hybrid resist process with submicron capability, SPIE vol. 333 Submicron Lithography pp. 24–29 (1982).

Hilt, Dissertation: Materials Characterization of Silver Chalcogenide Programmable Metallization Cells, Arizona State University, pp. title page–114 (UMI Company, May 1999).

Holmquist et al., Reaction and Diffusion in Silver–Arsenic Chalcogenide Glass Systems, 62 J. Amer. Ceramic Soc., Nos. 3–4, pp. 183–188 (Mar.–Apr. 1979).

Huggett et al., Development of silver sensitized germanium selenide photoresist by reactive sputter etching in $SF_6$, 42 Appl. Phys. Lett., No. 7, pp. 592–594 (Apr. 1983).

Kawaguchi et al., Mechanism of photosurface deposition, 164–166 J. Non–Cryst. Solids, pp. 1231–1234 (1993).

McHardy et al., The dissolution of metals in amorphous chalcogenides and the effects of electron and ultraviolet radiation, 20 J. Phys. C: Solid State Phys., pp. 4055–4075 (1987).

Miyatani, Electrical Porporties of $Ag_2Se$, 13 J. Phys. Soc. Japan, p. 317 (1958).

Mizusaki et al. Kinetic Studies on the Selenization of Silver, 47 Bul. Chem. Soc. Japan, No. 11 pp. 2851–2855 (Nov. 1974).

Owens et al., Metal–Chalcogenide Photoresists for High Resolution Lithography and Sub–Micron Structures, Nanostructure Physics and Fabrication, pp. 447–451 (Academic Press, 1989).

Safran et al., TEM study of $Ag_2Se$ developed by the reaction of polycrystalline silver films a nd selenium, 317 Thin Solid Films, pp. 72–76 (1998).

Shimizu et al., The Photo–Erasable Memory Switching Effect of Ag Photo–Doped Chalcogenide Glasses, 46 Bull. Chem. Soc. Japan, No. 12, pp. 3662–3665 (Dec. 1973).

Somogyi et al., Temperature Dependence of the Carrier Mobility in $Ag_2Se$ Layers Grown on NaCl and $SiO_x$ Substrates, 74 Acta Physica Hungarica, No. 3, pp. 243–255 (1994).

Tai et al., Multilevel Ge–Se film based resist systems, SPIE vol. 333 Submicron Lithography, pp. 32–39 (Mar. 1982).

Tai et al., Submicron optical lithography using an inorganic resist/polymer bilevel scheme, 17 J. Vac. Sci, Technol., No. 5, pp. 1169–1176 (Sep./Oct. 1980).

West, Dissertation, Electrically Erasable Non–Volatile Memory Via electrochemical Deposition of Multifractal Aggregates, Arizone State University, pp. title page–168 (UMI Co., May 1998).

West et al., Equivalent Circuit Modeling of the $Ag/As_{0.24}S_{0.36}Ag_{0.40}/Ag$ System Prepared by Photodissolution of Ag, 145 J. Electrochem. Soc., No. 9, pp. 2971–2974 (Sep. 1998).

Yoshikawa et al., A new inorganic electron resist of high contrast, 31 Appl. Phys. Lett., No. 3, pp. 161–163 (Aug. 1977).

Yoshikawa et al., Dry development of Se–Ge Inorganic photoresist, 36 Appl. Phys. Lett., No. 1, pp. 107–109 (Jan. 1980).

Abdel–Ali, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable swithches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunctions of polycrystalline selenium–silver selenide, Phys. Stat. Sol. (a) (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G.; Polarized memory switching effects in Ag2Se/Se/M thin film sandwiches, Thin solid films 97 (1982) 165–171.

Bernede, J.C.; Khelil, A.; Kettaf, M.; Conan, A., Transition from S–to N–type differential negative resistance in Al–Al2O3–Ag2–xSe1+x thin film structures, Phys. Stat. Sol. (a) 74 (1982).

Bondarev, V.N.; Pikhitsa, P.V., a dendrite model of current instability in rbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Based in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweller, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P.; Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 44221–0030.

Boolchand, P.; Grothaus, J, Molecular Structure of Melt–Quenched GeSe2 and GeS2 glasses compared, Proc. Int. Conf. Phys. Semicond. (Ed. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P., Intrinsically broken chalcogen chemical order in stoichiometric glasses, Journal de Physique 42 (1981) C4–193–C4–196.

Bresser, W.J.; Boochand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K. Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J.; Chen, W., Effect of Si3N4 on chemical durability of chalcogenide glass, J. Non–Cryst. Solids 220 (1997) 249–253.

Cohen, M.H.; Neele, R.G.; Paskin, A., A model for an amorphous semiconductor memory device, J. Non–Cryst. Solids 8–10 (1972) 885–891.

Croitoru, N.; Lezarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs. time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism of metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchang, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.-P.; Rouxel, T.; Sangleboeuf, J.-C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl.. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy $Ge_xSe_{1-x}$ around the stiffness threshold composition, J. Optoelectronics and Advanced Materials 3 (2001) 199–214.

Hu, J.; Snell, A.J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of $Ge_2S_3$, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous $As_2Se_7$ before switching, Phys. Stat. Sol. (a) 13 (1972) K105–K109.

Joullie, A.M.; Marucchi, J., Electrical properties of the amorphous alloy $As_2Se_5$, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of $Ag_x(GeSe_3)_{1-x}$ ($0<=x<=0.571$) glasses, Solid state Ionics 123 (1999) 259–269.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (9181) 16–19.

Lal, M.; Goyal, N., Chemical bond approach to study the memory and threshold switching chalcogenide glasses, Indian Journal of pure & & appl. phys. 29 (1991) 303–304.

Leimer, F.; Stotzel, H.; Kottwicz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in $Ge_xSe_{1-x}$ glass, Appl. Phys. Lett. 46 (1985) 543–545.

Matsushita, T.; Yamagami, T.; Okuda, M., Polarized memory effect observed on Se–$SnO_2$ system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in $TeO_2$–$V_2O_5$ based glasses, Journal de Physique IV 2 (1992) C2–185—C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in $(Ag_xCu_{1-x})_2S$, J. Phys. Soc. Japan 34 (1973) 423–432.

Miyatani, S.–y., Ionic conduction in beta–$Ag_2Te$ and beta–$Ag_2Se$, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.g.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shematova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama, Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.;Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chattejee, R.; Asokan, S., Electrical switching and short–range order in As–Te glasses, Phys. Rev. B 48 (1993) 14650–14652.

Tranchant, S.;Peytavin,S.;Ribes,M.;Flank,A.M.;Dexpert, H.;Lagarde,J.P., Silver chalcogenide glasses Ag–Ge–Se: Ionic conduction and exafs structural Investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>–2.4), J. Non–Cryst. Solids 151 (1992) 149–154.

U.S. patent application Ser. No. 09/732,968, Gilton, filed Dec. 8, 2000.

U.S. patent application Ser. No. 09/779,983, Moore, filed Feb. 8, 2001.

U.S. patent application Ser. No. 09/943,190, Campbell et al., filed Aug. 29, 2001.

U.S. patent application Ser. No. 09/943,199, Campbell et al., filed Aug. 29, 2001.

U.S. patent application Ser. No. 09/943,187, Campbell et al., filed Aug. 29, 2001.

U.S. patent application Ser. No. 09/921,518, Moore, filed Aug. 1, 2001.

U.S. patent application Ser. No. 10/061,825, Gilton et al., filed Jan. 31, 2002.

U.S. patent application Ser. No. 10/077,867, Campbell et al., filed Feb. 20, 2002.

U.S. patent application Ser. No. 10/232,757, Li et al., filed Aug. 29, 2002.

* cited by examiner

CHALCOGENIDE COMPRISING DEVICE

CROSS REFERENCE TO RELATED APPLICATION

This application is a divisional of U.S. patent application Ser. No. 09/999,883 which was filed on Oct. 31, 2001, and which is incorporated by reference herein. The Ser. No. 09/999,883 application was a divisional application of U.S. patent application Ser. No. 09/797,635 which was filed on Mar. 1, 2001 and which is incorporated by reference herein.

TECHNICAL FIELD

This invention relates to non-volatile resistance variable devices and methods of forming the same.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Nonvolatile memory circuitry retains the stored data even when power is interrupted.

This invention was principally motivated in making improvements to the design and operation of memory circuitry disclosed in the Kozicki et al. U.S. Pat. Nos. 5,761,115; 5,896,312; 5,914,893; and 6,084,796, which ultimately resulted from U.S. patent application Ser. No. 08/652,706, filed on May 30, 1996, disclosing what is referred to as a programmable metalization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a chemical and structural change at a certain applied voltage. Specifically, at some suitable threshold voltage, plating of metal from metal ions within the material begins to occur on the cathode and grows or progresses through the fast ion conductor toward the other anode electrode. With such voltage continued to be applied, the process continues until a single conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide with silver ions. The present method of providing the silver ions within the germanium selenide material is to initially deposit the germanium selenide glass without any silver being received therein. A thin layer of silver is thereafter deposited upon the glass, for example by physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material, thereby effecting dissolution of silver into the germanium selenide glass. The applied energy and overlying silver result in the silver migrating into the glass layer such that a homogenous distribution of silver throughout the layer is ultimately achieved.

It can be challenging to etch and to chemical-mechanical polish metal ion containing chalcogenide materials. Accordingly it would be desirable to develop memory cell fabrication methods which avoid one or both of etching or polishing such materials. It would also be desirable to develop alternate methods from that just described which incorporate the metal ions into chalcogenide materials. While the invention was principally motivated in achieving objectives such as these, the invention is in no way so limited. The artisan will appreciate applicability of the invention in other aspects of processing involving chalcogenide materials, with the invention only being limited by the accompanying claims as literally worded and as appropriately interpreted in accordance with the doctrine of equivalents.

SUMMARY

The invention includes non-volatile resistance variable devices and methods of forming the same. In one implementation, a method of metal doping a chalcogenide material includes forming a metal over a substrate. A chalcogenide material is formed on the metal. Irradiating is conducted through the chalcogenide material to the metal effective to break a chalcogenide bond of the chalcogenide material at an interface of the metal and chalcogenide material and diffuse at least some of the metal outwardly into the chalcogenide material. In one implementation, a method of metal doping a chalcogenide material includes surrounding exposed outer surfaces of a projecting metal mass with chalcogenide material. Irradiating is conducted through the chalcogenide material to the projecting metal mass effective to break a chalcogenide bond of the chalcogenide material at an interface of the projecting metal mass outer surfaces and diffuse at least some of the projecting metal mass outwardly into the chalcogenide material. In certain aspects, the above implementations are incorporated in methods of forming non-volatile resistance variable devices.

In one implementation, a non-volatile resistance variable device in a highest resistance state for a given ambient temperature and pressure includes a resistance variable chalcogenide material having metal ions diffused therein. Opposing first and second electrodes are received operatively proximate the resistance variable chalcogenide material. At least one of the electrodes has a conductive projection extending into the resistance variable chalcogenide material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts"(Article 1, Section 8).

Figure 1:
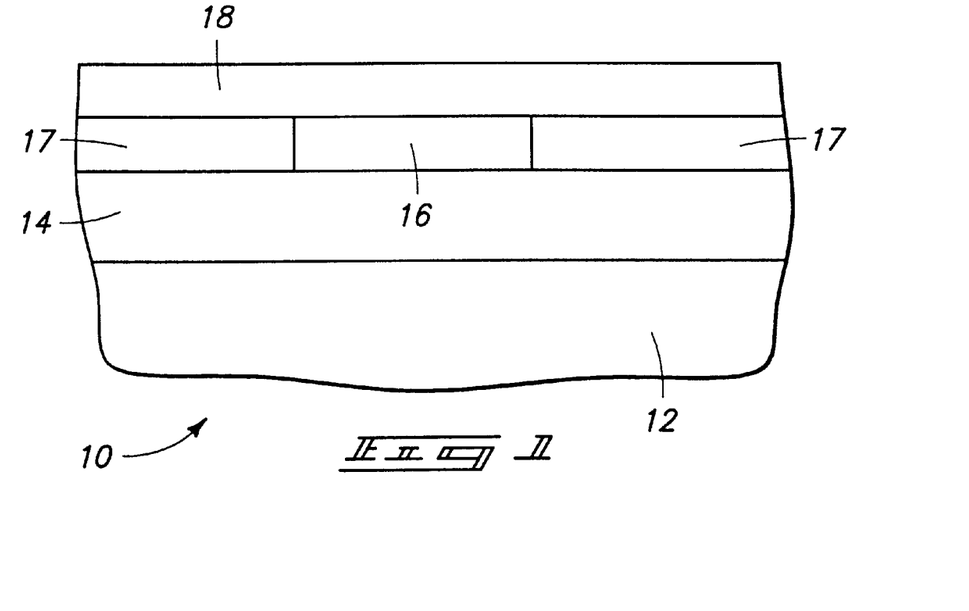
FIG. 1 is a diagrammatic sectional view of a semiconductor wafer fragment in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metalization cells and programmable optical elements of the patents referred to above, further by way of example only, including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance setable semiconductive material" and "resistance variable device" includes materials and devices wherein a property or properties in addition to resistance is/are also varied. For example, and by way of example only, the material's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A conductive electrode material 16, also termed a first metal layer, is formed over and on dielectric layer 14. By way of example only, preferred materials include any of those described in the incorporated Kozicki et al. patents referred to above in conjunction with the preferred type of device being fabricated. Layer 16 might constitute a patterned electrode for the preferred non-volatile resistance variable device being fabricated. Alternately by way of example only, layer 16 might constitute a patterned line or extension of a field effect transistor gate, with a subsequently deposited layer principally serving essentially as the electrode. An example preferred material for layer 16 is elemental tungsten deposited to an exemplary thickness of from about 100 Angstroms to about 1000 Angstroms. In the illustrated example, layer 16 has been patterned, and another dielectric layer 17 has been deposited and planarized as shown.

A second metal layer 18 is formed (preferably by a blanket deposition) on first metal layer 16. An exemplary preferred material in conjunction with the non-volatile resistance variable device being fabricated is elemental silver. A preferred thickness for layer 18 is from about 175 Angstroms to about 300 Angstroms.

Figure 2:
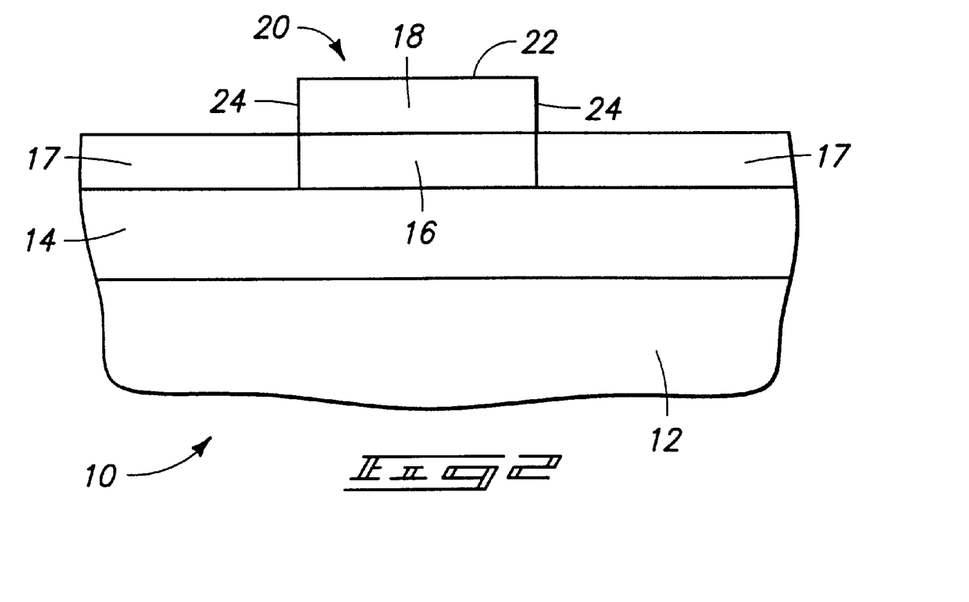
FIG. 2 is a view of the FIG. 1 wafer fragment at a processing step subsequent to that shown by FIG. 1.

Referring to FIG. 2, second metal layer 18 is formed into a structure 20, and first metal layer 16 is outwardly exposed. Such is preferably conducted by subtractive patterning of metal layer 18, for example by photolithographic patterning and etch. In one implementation, structure 20 can be considered as comprising a metal mass projecting from underlying substrate material and having outer surfaces comprised of a top surface 22 and opposing side surfaces 24 which join with top surface 22 at respective angles. The preferred angles are preferably within about 15° of normal, with normal angles being shown in the figures.

Figure 3:
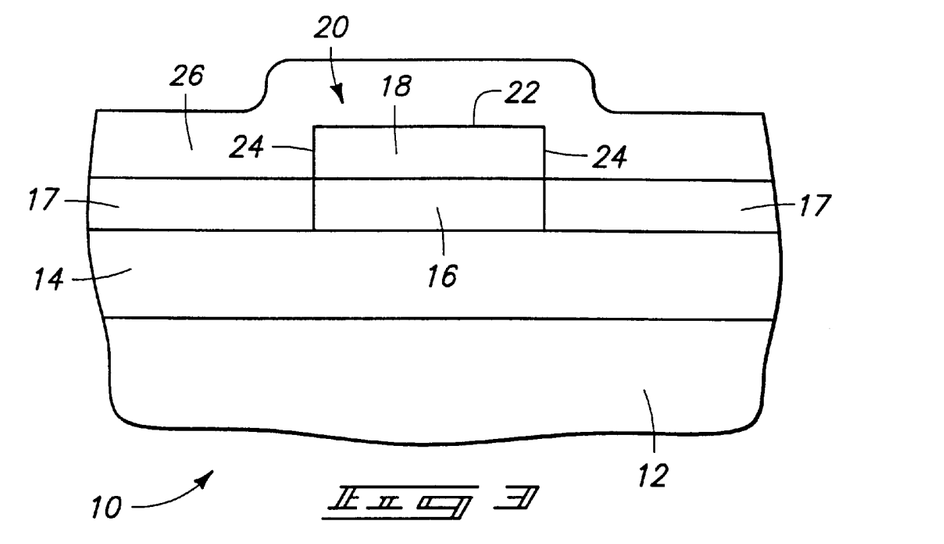
FIG. 3 is a view of the FIG. 1 wafer fragment at a processing step subsequent to that shown by FIG. 2.

Referring to FIG. 3, a chalcogenide material 26 is formed over the substrate on second metal structure 20 outer surfaces 22 and 24, and on exposed first metal layer 16. Such is preferably formed by blanket physical vapor deposition. A preferred deposition thickness for layer 26 is preferably less than three times the thickness of deposited layer 18, with an example being from about 525 Angstroms to about 900 Angstroms. More preferred is a thickness to provide layer 18 at 20% to 50% of layer 26 thickness. Exemplary preferred chalcogenide materials include those disclosed in the Kozicki et al. patents referred to above. Specific preferred examples include a chalcogenide material having metal ions diffused therein represented by the formula $Ge_xA_y$, where "A" is selected from the group consisting of Se, Te and S and mixtures thereof. The illustrated example provides but one possible example of surrounding the exposed outer surfaces of a projecting metal mass with chalcogenide material in accordance with but one aspect of the invention.

Figure 4:
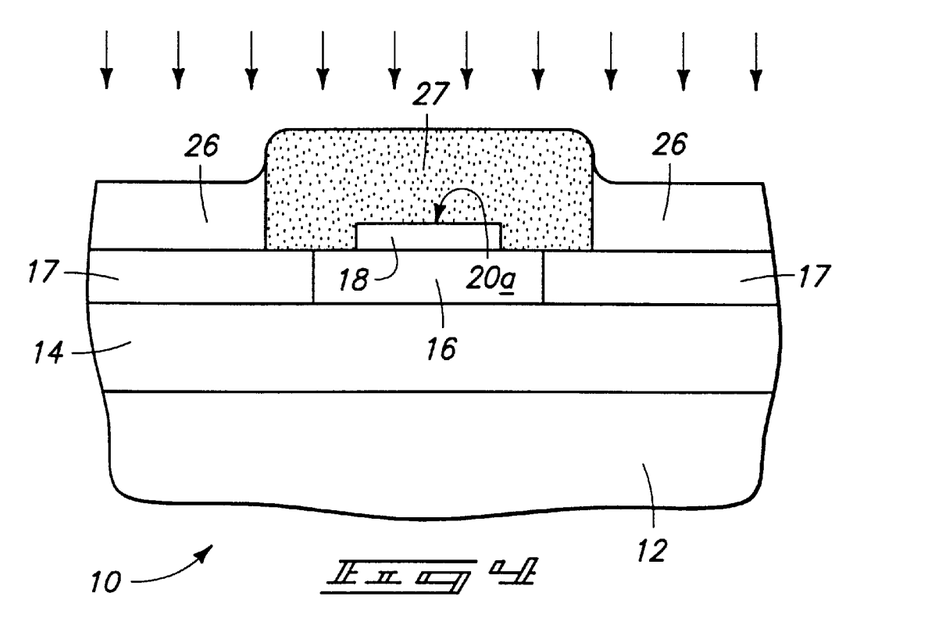
FIG. 4 is a view of the FIG. 1 wafer fragment at a processing step subsequent to that shown by FIG. 3.

Referring to FIG. 4, irradiating is conducted through chalcogenide material 26 to patterned second metal 18 effective to break a chalcogenide bond of the chalcogenide material at an interface with the patterned second metal outer surfaces and the chalcogenide material, and to diffuse at least some of second metal 18 outwardly into the chalcogenide material. Metal doped material 27 is formed thereby. Therefore as shown in the preferred embodiment, only a portion of blanket deposited chalcogenide material layer 26 is doped with second metal 18. A preferred irradiating includes exposure to actinic radiation having a wavelength below 500 nanometers, with radiation exposure at between 404–408 nanometers being a more specific example. A specific example in a suitable UV radiation flood exposure tool is 4.5 mW/cm$^2$, 15 minutes, 405 nm wavelength, at room ambient temperature and pressure.

Figure 5:
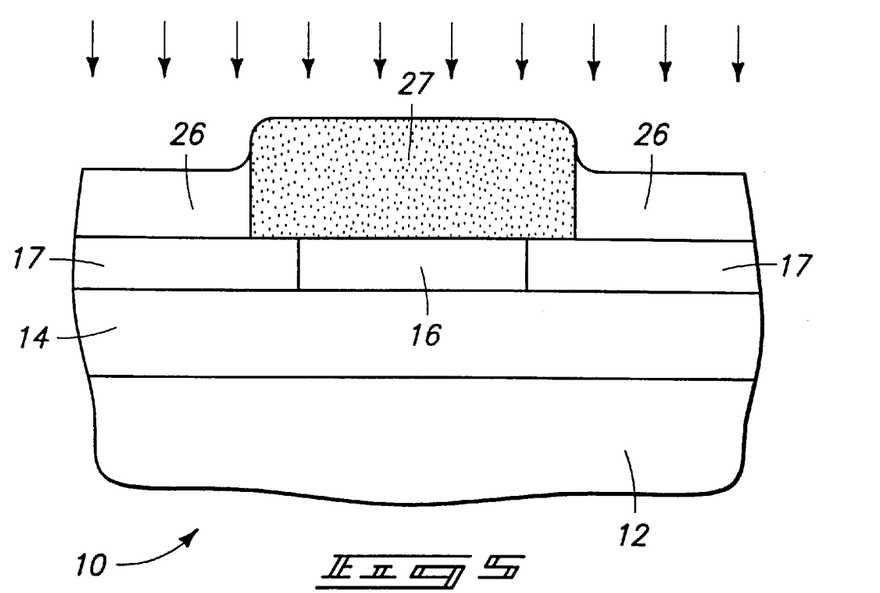
FIG. 5 is a view of the FIG. 1 wafer fragment at an alternate processing step subsequent to that shown by FIG. 3.

In the depicted and preferred embodiment, the irradiating diffuses only some of the metal from layer 18 outwardly into chalcogenide material, leaving a remnant structure 20a. Accordingly, the projecting metal mass 20a has a shape after the irradiating which is maintained in comparison to original shape 20, but at a reduced size. FIG. 5 illustrates a lesser preferred alternate embodiment 10*a* whereby the irradiating and/or layer dimensions might be modified such that the irradiating diffuses all of projecting metal mass 20 outwardly into the chalcogenide material.

Figure 6:
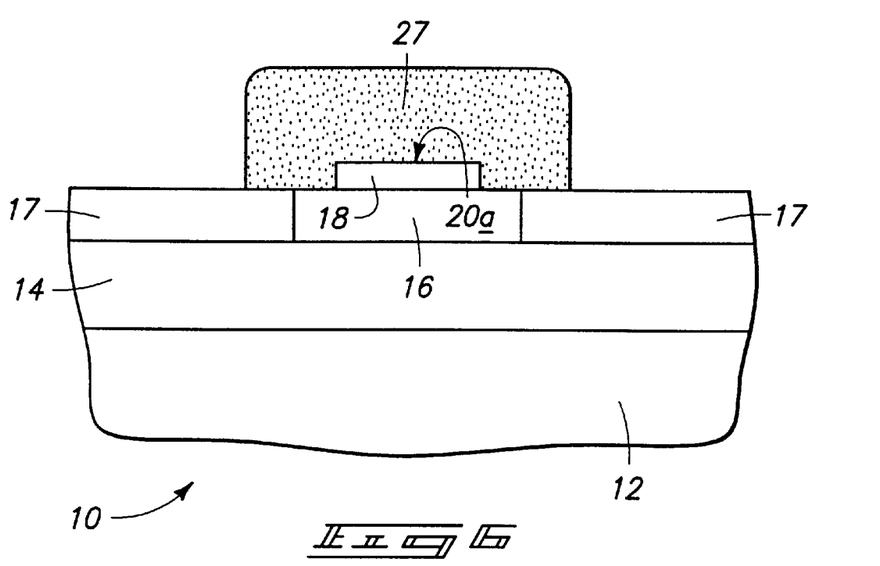
FIG. 6 is a view of the FIG. 1 wafer fragment at a processing step subsequent to that shown by FIG. 4.

The preferred exemplary tungsten material of layer 16 does not appreciably diffuse into layer 26. Referring to FIG. 6 and regardless, chalcogenide material 26 not doped with metal 18 is substantially selectively etched from metal doped portion 27 of the chalcogenide material. In the context of this document, "substantially selective" means a relative etch ratio of layer 26 relative to layer 27 or at least 3:1. In the illustrated and preferred embodiment, such etching is preferably conducted to remove all of chalcogenide material 26 which has not been doped with metal 18. The preferred etching comprises dry anisotropic etching, preferably dry plasma anisotropic etching. A principle preferred component of such etching gas comprises $CF_4$. Additional preferred gases in the chemistry include $C_2F_6$ and $C_4F_8$. Top power is preferably maintained at 500 watts, with the lower wafer susceptor being allowed to float. Susceptor temperature is preferably maintained at about 25° C., and an exemplary reactor pressure is 50 mTorr. By way of example only, a specific example in a reactive ion etcher is $CF_4$ at 50 sccm, Ar at 25 sccm, susceptor temperature at 25° C., pressure of 50 mTorr and top power at 500 Watts.

Figure 7:
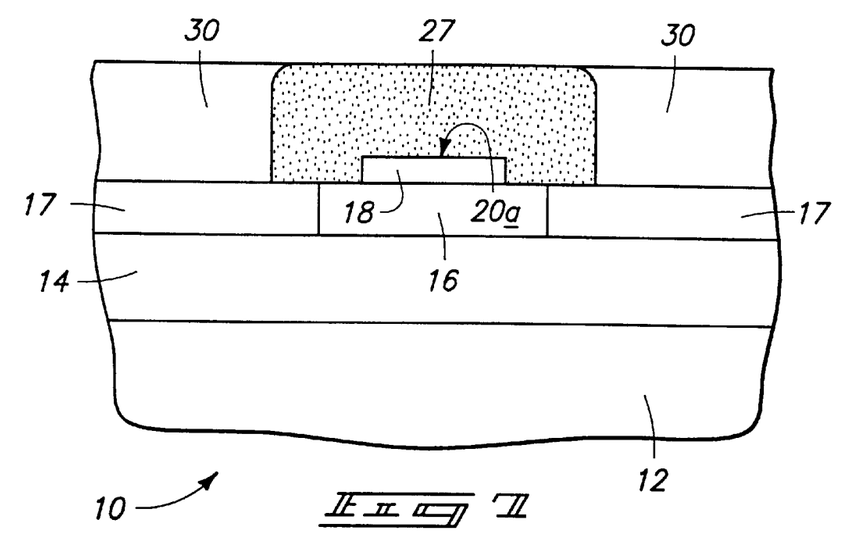
FIG. 7 is a view of the FIG. 1 wafer fragment at a processing step subsequent to that shown by FIG. 6.

Referring to FIG. 7, an insulating layer 30 has been deposited and metal doped chalcogenide material 27 has been exposed. An example and preferred material for layer 30 is silicon nitride.

Figure 8:
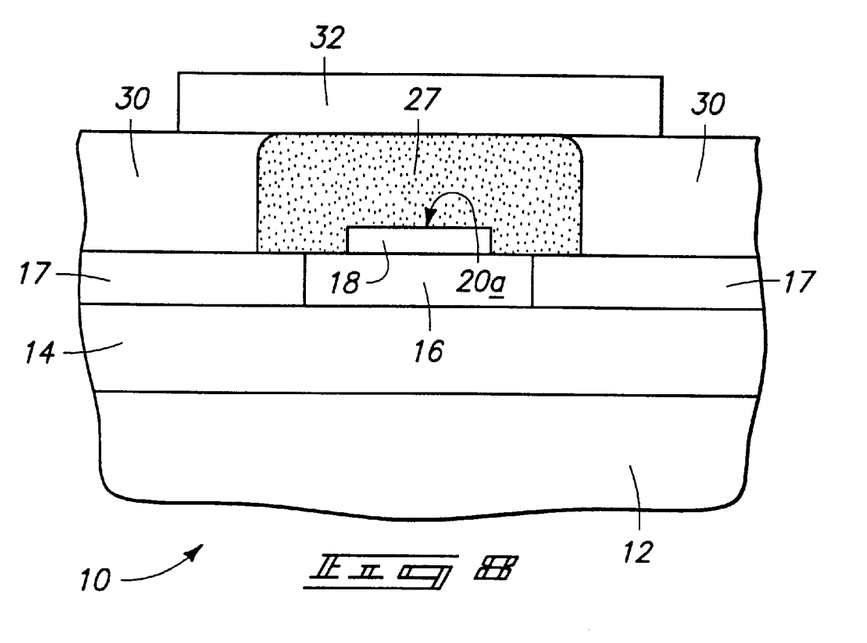
FIG. 8 is a view of the FIG. 1 wafer fragment at a processing step subsequent to that shown by FIG. 7.

Referring to FIG. 8, an outer conductive electrode layer 32 has been deposited and patterned to form the outer electrode of the preferred non-volatile resistance variable device. Example materials include those disclosed in the above Kozicki et al. patents. In the illustrated and described preferred example, silver structure 20*a* might be designed and fabricated to constitute the effective quantity of silver for programming the device with no silver being provided in electrode 32. Alternately by way of example only, layer 16 might also constitute elemental silver with no silver being provided in electrode 32. Further, by way of example only, electrode 32 might principally comprise elemental silver, or at least a lower silver portion in contact with the chalcogenide material 27.

The above-described preferred embodiment example was in conjunction with fabrication of a non-volatile resistance variable device. However, the invention also contemplates metal doping a chalcogenide material independent of the device being fabricated, and in the context of the accompanying claims as literally worded regarding methods of metal doping a chalcogenide material. Further, the preferred example is with respect to formation of a projecting metal from an underlying substrate having chalcogenide material received thereover. However, the invention is in no way so limited and also contemplates, by way of example only, diffusing metal from an entirely flat, or other, underlying surface into overlying chalcogenide material.

The invention also contemplates non-volatile resistance variable devices independent of the method of manufacture. In one implementation, such a device includes a projecting metal mass (for example mass 20*a*) extending outwardly from a first metal layer laterally central into resistance variable chalcogenide material. In one aspect, the invention contemplates the device being in a highest resistance state for a given ambient temperature and pressure. For example, the FIG. 8 device as depicted is in such a highest state of resistance. Progressively lower states of resistance for a given ambient temperature and pressure will exist as a silver dendrite, in the preferred embodiment, progressively grows from an electrode to the point of contacting the opposing electrode. FIG. 8 depicts but one exemplary embodiment of such a non-volatile resistance variable device having such a laterally central located projecting mass relative to material 27.

The invention also contemplates a non-volatile resistance variable device in a highest resistance state for a given ambient temperature and pressure independent of a conductive projection which is so centrally located. Such comprises a resistance variable chalcogenide material having metal ions diffused therein. Opposing first and second electrodes are received operatively proximate the resistance variable chalcogenide material, with at least one of the electrodes comprising a conductive-projection extending into the resistance variable chalcogenide material. Provision of such a structure is in no way shown or suggested in a highest resistance state for a given ambient temperature and pressure in any of the teachings and drawings of the above, described Kozicki et al. patents.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chalcogenide comprising device, comprising:

a substrate comprising a first electrode;

an insulative layer received over the first electrode;

a resistance variable chalcogenide material having metal ions diffused therein received within an opening formed through the insulative layer;

a contoured metal-donating region provided over the first electrode and extending outwardly from the first electrode laterally central into the resistance variable chalcogenide material; and a second electrode spaced from the contoured metal-donating region and first electrode operatively adjacent the resistance variable chalcogenide material.

2. The device of claim 1 in a highest resistance state for a given ambient temperature and pressure.

3. The device of claim 1 wherein the contoured metal-donating region comprises a top surface joined with opposing side surfaces at respective angles.

4. The device of claim 1 wherein contoured metal-donating region comprises a top surface joined with opposing side surfaces at respective angles within about 15° of normal.

5. The device of claim 1 wherein the contoured metal-donating region comprises elemental silver.

6. The device of claim 1 wherein the chalcogenide material having metal ions diffused therein comprises $Ge_xA_y$, where A is selected from the group consisting of Se, Te and S, and mixtures thereof.

7. The device of claim 1 wherein the first electrode and the contoured metal-donating region comprise the same material.

8. The device of claim 1 wherein the first electrode and the contoured metal-donating region comprise elemental silver.

\* \* \* \* \*

UNITED STATES PATENT AND TRADEMARK OFFICE
CERTIFICATE OF CORRECTION

PATENT NO. : 6,710,423 B2
DATED : March 23, 2004
INVENTOR(S) : John T. Moore et al.

It is certified that error appears in the above-identified patent and that said Letters Patent is hereby corrected as shown below:

Title page,
Item [56], References Cited, OTHER PUBLICATIONS, insert the following:
-- Johnson, et al., Lateral Diffusion in Ag-Se Thin-Film Couples, 40 Journal of Applied Physics, No. 1 pp. 149-152 (January 1969).
Chen, G.; Cheng J., Role of nitrogen in the crystallization of silicon nitridedoped chalcogenide glasses, J.Am. Ceram. Soc 82 (1999) 2934-2936.
Hu, J; Snell A-J; Owen, A.E., Constant current forming Cr/p+a/Si:H/V thin film devices, J. Non-Cryst. Solids 227-230 (1998) 1187-1191. --

Column 1,
Line 47, the word "swithches" should be -- switches --.

Signed and Sealed this

Fourth Day of January, 2005

JON W. DUDAS
*Director of the United States Patent and Trademark Office*